(12) United States Patent
Kuo et al.

(10) Patent No.: US 7,491,583 B2
(45) Date of Patent: Feb. 17, 2009

(54) POWER MODULE FABRICATION METHOD AND STRUCTURE THEREOF

(75) Inventors: Chin Chi Kuo, Taoyuan Hsien (TW); Yi Hwa Hsieh, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 442 days.

(21) Appl. No.: 11/371,562

(22) Filed: Mar. 9, 2006

(65) Prior Publication Data
US 2007/0090513 A1   Apr. 26, 2007

(30) Foreign Application Priority Data
Oct. 26, 2005 (TW) .............................. 94137506 A

(51) Int. Cl.
*H01L 21/00* (2006.01)
(52) U.S. Cl. .................. 438/122; 438/125; 257/796
(58) Field of Classification Search ................ 438/122, 438/125; 257/796
See application file for complete search history.

(56) References Cited
U.S. PATENT DOCUMENTS 4,736,273 A * 4/1988 Vertongen et al. ........... 361/717
4,859,631 A * 8/1989 Barre ........................... 29/840
5,835,352 A * 11/1998 Matsuzaki et al. ........... 361/707
6,177,632 B1 * 1/2001 Ashdown ..................... 174/541
7,309,916 B2 * 12/2007 Kang et al. .................. 257/697

* cited by examiner

*Primary Examiner*—Trung Dang

(57) ABSTRACT

A power module fabrication method and structure thereof is disclosed. The method includes steps of: providing a metal plate and defining a pattern on the metal plate; cutting the metal plate according to the pattern to form a plurality of pins and the heat-conducting plate, wherein the pin is coupled to each other or to the metal plate via a connection part and the heat-conducting plate is coupled to the connection part via a fixing part; bending a first end of the pin to form an extension part and bending the fixing part to dispose the heat-conducting plate and the metal plate at different levels; providing a circuit board with a plurality of via holes and inserting the extension part into the via hole correspondingly and fixing the pin on the circuit board; forming a housing to encapsulate the circuit board therein, wherein the heat-conducting plate is inlaid on the housing and a second end of the pin is extended out of the housing; and cutting the connection part and the fixing part to separate the pin from each other and from the metal plate and isolate the pin and the heat-conducting plate.

10 Claims, 12 Drawing Sheets

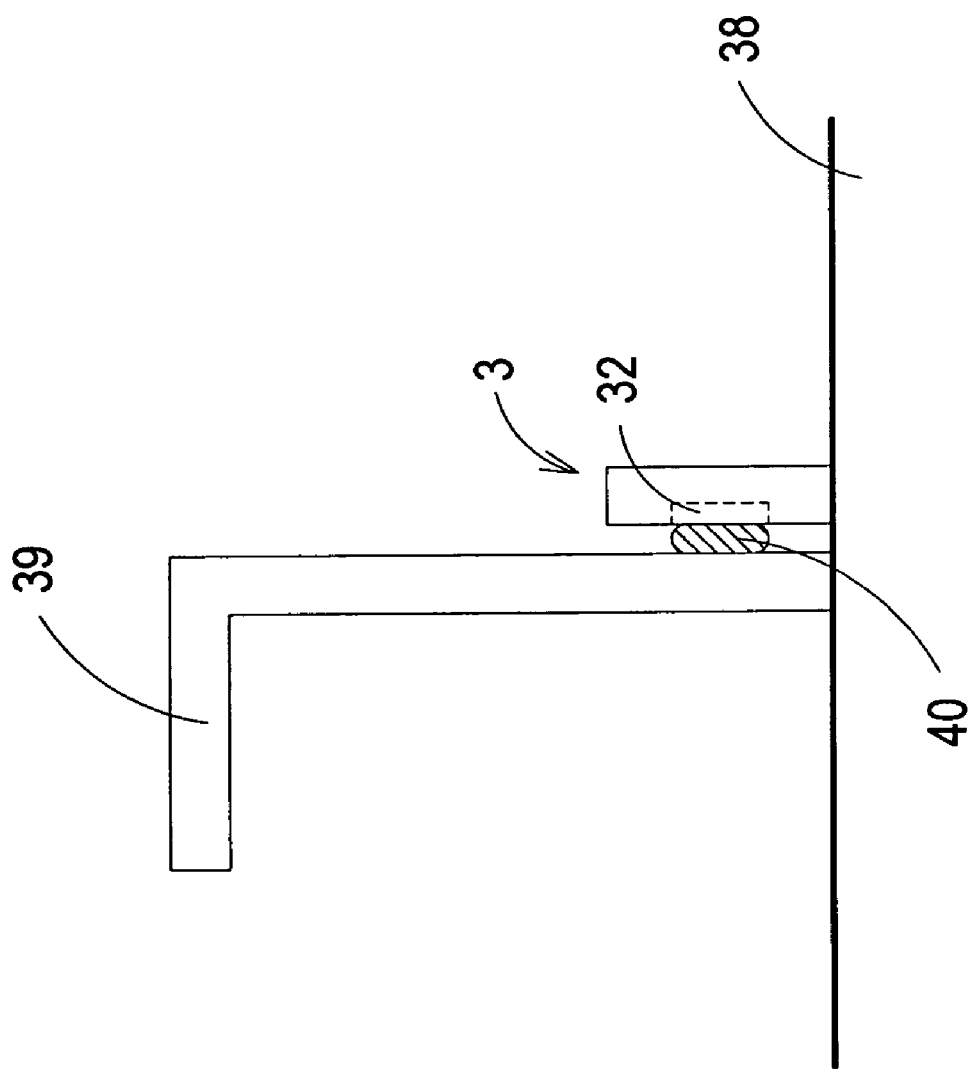

POWER MODULE FABRICATION METHOD AND STRUCTURE THEREOF

FIELD OF THE INVENTION

The present invention relates to a power module fabrication method and the structure thereof, and more particularly to a fabrication method of a miniaturized power module and the structure thereof.

BACKGROUND OF THE INVENTION

Generally speaking, the electronic equipment relies on the power module like adaptor or built-in power for converting the input voltage into the working voltage, therefore the working voltage can drive the electronic equipment. Take the conventional adaptor for example; the structure comprises the upper and lower housings to encapsulate the circuit board therein. The input voltage is converted into the working voltage by the electronic components such as capacitor, resistor, transformer, and diode on the circuit board of the power module for keeping the operation of the electronic equipment.

The voltage converting efficiency of the power module is getting higher with the increasing working efficiency of the electronic equipment; therefore a lot of heat is produced by those high power electronic components on the circuit board. For dissipating the heat produced by those high power electronic components, a certain space is designed in the housing or a heat sink is attached on those high power electronic components to dissipate heat by conduction, so as to avoid over-temperature shutdown of the electronic components.

With the requirement of the miniaturization, portability, high efficiency and stability of the electronic equipments, it is necessary to fabricate a miniaturized power module with high stability and low cost. However, to reduce the volume of the power module is not a simple task if a certain space has to be reserved in the housing or a heat sink is to be attached on the electronic component on the circuit board for dissipating heat.

Although the miniaturized power module to be plugged into the system circuit board of the electronic equipment directly for generating the working voltage has already been developed in the market, the heat is dissipated only by conducting to the system circuit board through the pins of the miniaturized power module plugged into the system circuit board or by convection or radiation through the housing. Moreover, more heat is produced by the high power electronic components in the miniaturized power module, so the heat cannot be dissipated efficiently from the housing and the accumulated heat may cause the shutdown of the electronic equipment.

Therefore, it is required to develop a power module fabrication method and the structure thereof to improve the heat dissipation of the miniaturized power module, simplify the fabrication method and lower the cost.

SUMMARY OF THE INVENTION

An object of the present invention is to provide a fabrication method of a power module and the structure thereof, wherein the heat-conducting plate is inlaid on the housing directly while forming the housing, so as to simplify the fabrication method, secure the heat-conducting plate firmly and raise the heat dissipating efficiency of the power module. Moreover, the pins and the heat-conducting plate are made from the same metal plate for saving material and lowering the fabrication cost.

According to an aspect of the present invention, a fabrication method of a power module is provided. The fabrication method comprises steps of: providing a metal plate and defining a pattern on the metal plate; cutting the metal plate according to the pattern to form a plurality of pins and a heat-conducting plate, wherein the pin is coupled to each other or to the metal plate via a connection part and the heat-conducting plate is coupled to the connection part via a fixing part; bending a first end of the pin to form an extension part and bending the fixing part to dispose the heat-conducting plate and the metal plate at different levels; providing a circuit board with a plurality of via holes and inserting the extension part into the via hole correspondingly and fixing the pin on the circuit board; forming a housing to encapsulate the circuit board therein, wherein the heat-conducting plate is inlaid on the housing and a second end of the pin is extended out of the housing; and cutting the connection part and the fixing part to separate the pin from each other and from the metal plate and isolate the pin and the heat-conducting plate.

In an embodiment, the extension part of the pin is fixed in the via hole of the circuit board by soldering.

In an embodiment, the housing is formed by molding.

In an embodiment, the power module is a surface mounted device (SMD) power module and the second end of the pin is extended outwardly from two opposite sides of the housing, wherein the second end of the pin is further bent for connecting to a system circuit board.

In an embodiment, the power module is a single in-line package (SIP) power module and the second end of the pin is extended outwardly from one side of the housing for plugging into a system circuit board.

In an embodiment, the housing further comprises a protrusion having a length shorter than that of the pin outside the housing so as to form a heat-dissipating space among the protrusion, the housing and the system circuit board when the pin is plugged into the system circuit board.

In an embodiment, the heat-conducting plate is connected to a connecting area of a system circuit board by soldering for assisting heat dissipation.

In an embodiment, the heat-conducting plate is connected to a system heat-dissipater by soldering for assisting heat dissipation.

In an embodiment, the metal plate is a copper plate.

According to another aspect of the present invention, a structure of a power module is disclosed. The structure of a power module comprising: a circuit board with a plurality of via holes; a housing for encapsulating the circuit board therein; a plurality of pins, each having an extension part at a first end thereof, wherein the extension part is inserted into the via hole correspondingly to fix the pin on the circuit board, and a second end of the pin is extended out of the housing; and a heat-conducting plate inlaid on the housing for assisting heat dissipation of the power module.

In an embodiment, the pin and the heat-conducting plate are made from the same metal plate, wherein the metal plate is a copper plate.

In an embodiment, the heat-conducting plate is isolated from the circuit board.

The above objects and advantages of the present invention will become more readily apparent to those ordinarily skilled in the art after reviewing the following detailed description and accompanying drawings, in which:

BRIEF DESCRIPTION OF THE DRAWINGS

FIG. 6 is a schematic diagram showing the side view of the SIP power module of FIG. 5 connected to a system heat-dissipater.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
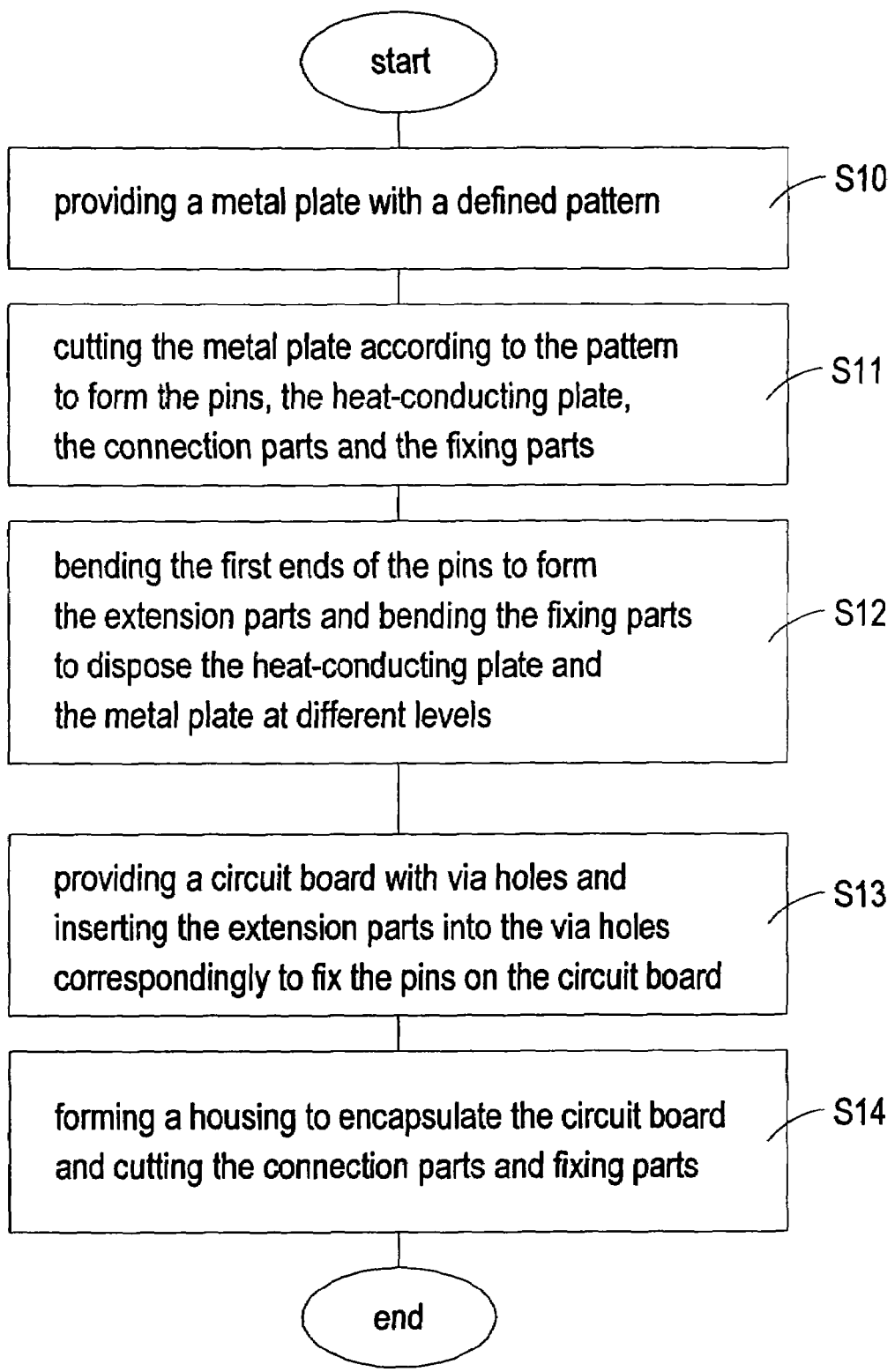
FIG. 1 is a flow chart for fabricating the power module according to the present invention.
Figure 2A:
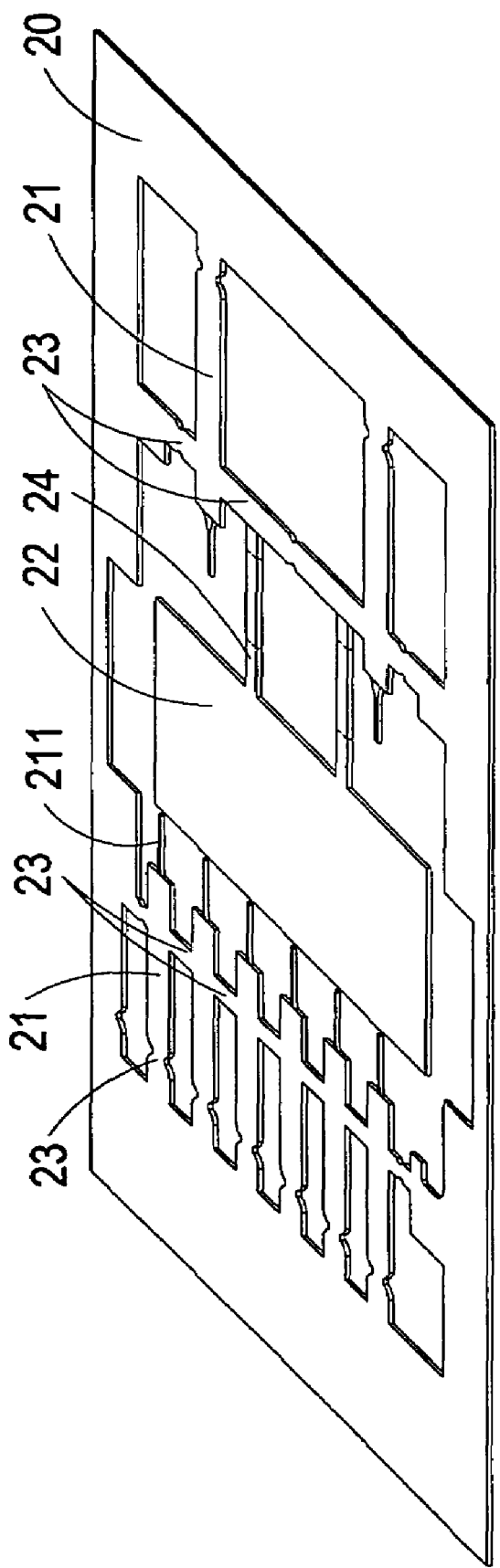
FIGS. 2(a)-(d) are schematic diagrams showing the fabrication processes of the power module according to a first preferred embodiment of the present invention.
Figure 2B:
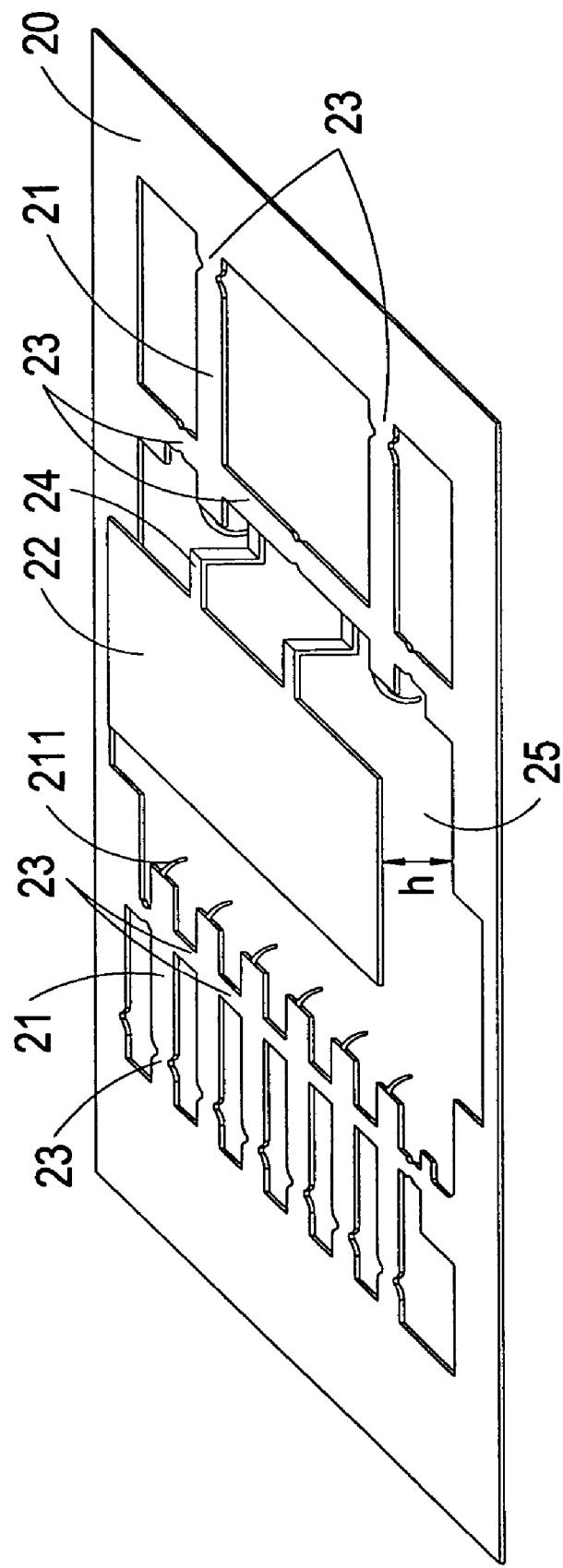
Figure 2C:
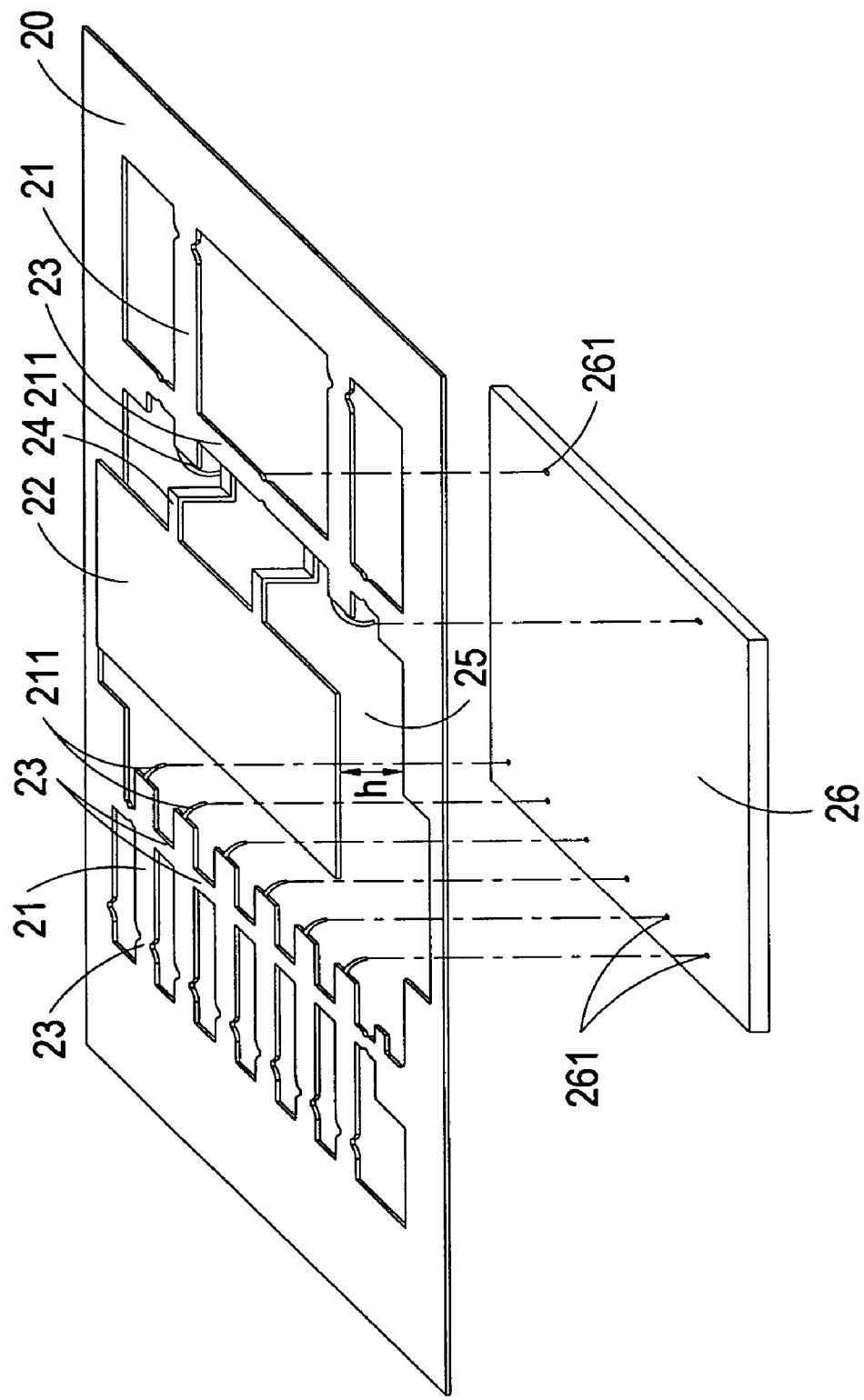
Figure 2D:
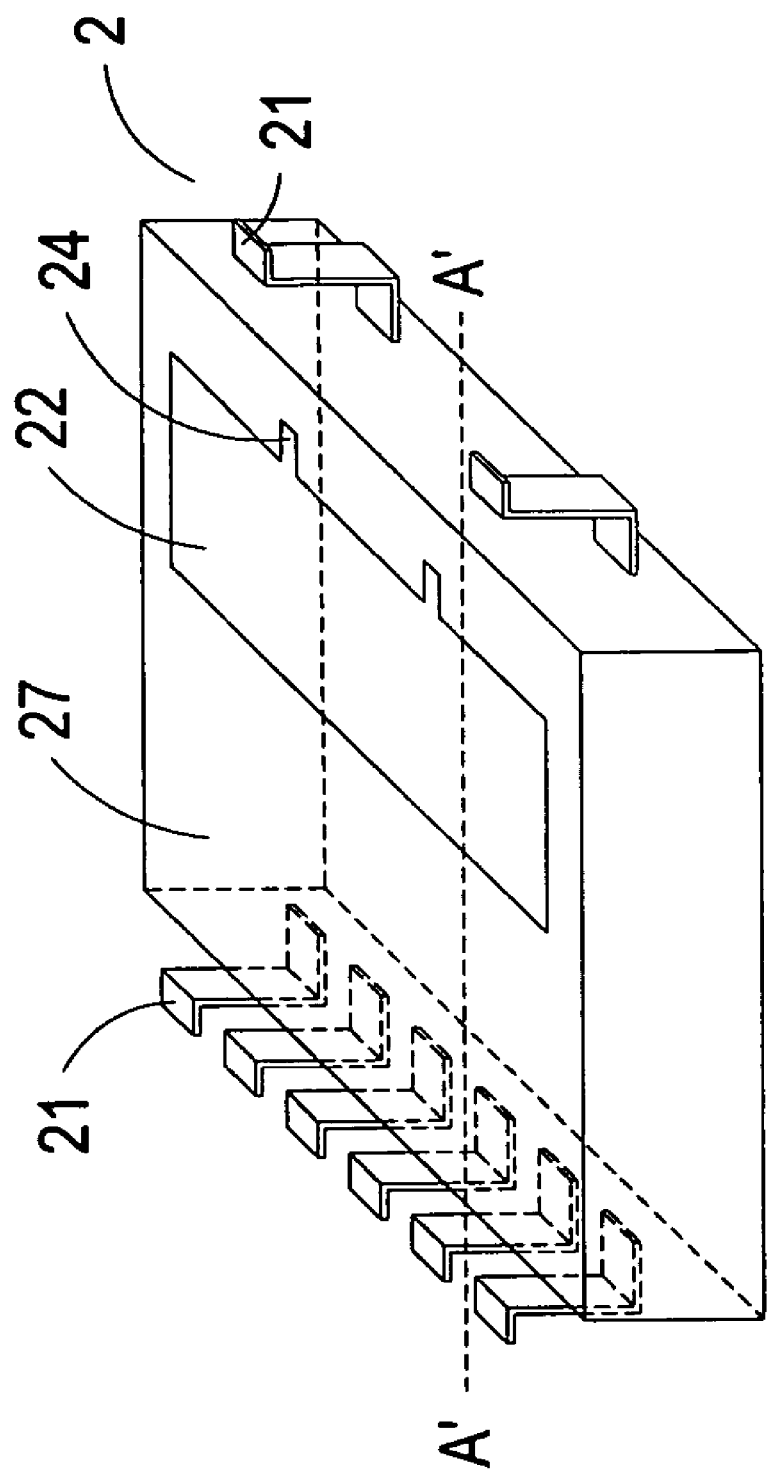

The power module in the first preferred embodiment of the present invention is a surface mounted device (SMD) power module 2 as shown in FIG. 2(d) by using the fabrication method as shown in FIG. 1 with the metal plate 20 and the circuit board 26 as shown in FIGS. 2(a)-(c).

Please refer to FIGS. 1 and 2(a)-(c), a metal plate 20 is provided and a pattern is defined on the metal plate 20 (step S10). The metal plate 20 can be any high thermal conductivity material, such as copper, but not limited thereto. Then the metal plate 20 is cut according to the pattern to form a plane structure with a plurality of pins 21, a heat-conducting plate 22, a plurality of connection parts 23, and a plurality of fixing parts 24 on the metal plate 20 (step S11) as shown in FIG. 2(a). The connection parts 23 are located between two pins 21 and between the pin 21 and the metal plate 20, therefore the pins 21 are connected to each other and retained on the metal plate 20 even after the cutting step S11. The fixing part 24 is located between the heat-conducting plate 22 and the connection part 23, so as to maintain the heat-conducting plate 22 on the metal plate 20.

Next, the first end of each pin 21 is bent downwardly in an angle, such as 90°, to form the extension part 211, meanwhile, the fixing part 24 is bent upwardly to lift the heat-conducting plate 22 up for a height h (step S12). Therefore the heat-conducting plate 22 and the extension part 211 are disposed at different sides of the metal plate 20 respectively. Since the heat-conducting plate 22 and the metal plate 20 are disposed at different levels, a space 25 is formed therebetween, as shown in FIG. 2(b).

Please refer to FIGS. 1 and 2(c), a circuit board 26, such as a printed circuit board, with a plurality of via holes 261 is provided. The extension part 211 of each pin 21 is inserted into the via hole 261 of the circuit board 26 correspondingly and penetrated therethrough, and then the extension part 211 of the pin 21 is fixed in each via hole 261 of the circuit board 26 (step S13). The fixing method can be soldering, but other fixing method applicable to the present invention can also be considered. Hence the pin 21 can be secured on the circuit board 26 firmly through the extension part 211 fixed in the via hole 261.

Then, a housing 27 is formed for encapsulating the circuit board 26 therein. The heat-conducting plate 22 is inlaid on the housing 27, as well as partial of the fixing part 24. The second end of each pin 21 is extended out of the housing 27 from two opposite sides thereof and parallel to the heat-conducting plate 22, and the connection part 23 is exposed out of the housing 27. In some embodiments, the housing 27 can be formed by molding, but not limited thereto. Afterward, the connection parts 23 between two pins 21 and between the pin 21 and the metal plate 20 are cut for separating the plural pins 21 from each other and from the metal plate 20 and also isolating each pin 21. Meantime, the fixing part 24 connecting to the heat-conducting plate 22 is cut for isolating the heat-conducting plate 22 from the plural pins 21 (step S14).

Finally, the pins 21 extended outwardly from the housing 27 are bent toward the normal direction of the heat-conducting plate 22, so as to form the SMD power module 2 as shown in FIG. 2(d).

Figure 3A:
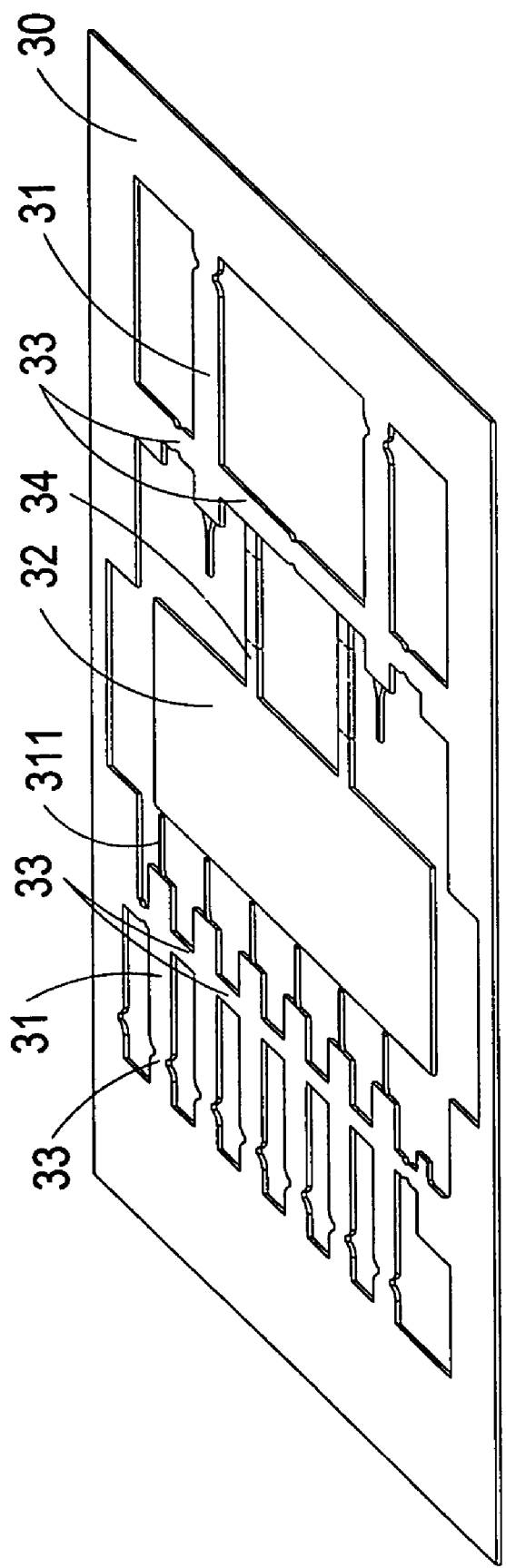
FIGS. 3(a)-(d) are schematic diagrams showing the fabrication processes of the power module according to a second preferred embodiment of the present invention.
Figure 3B:
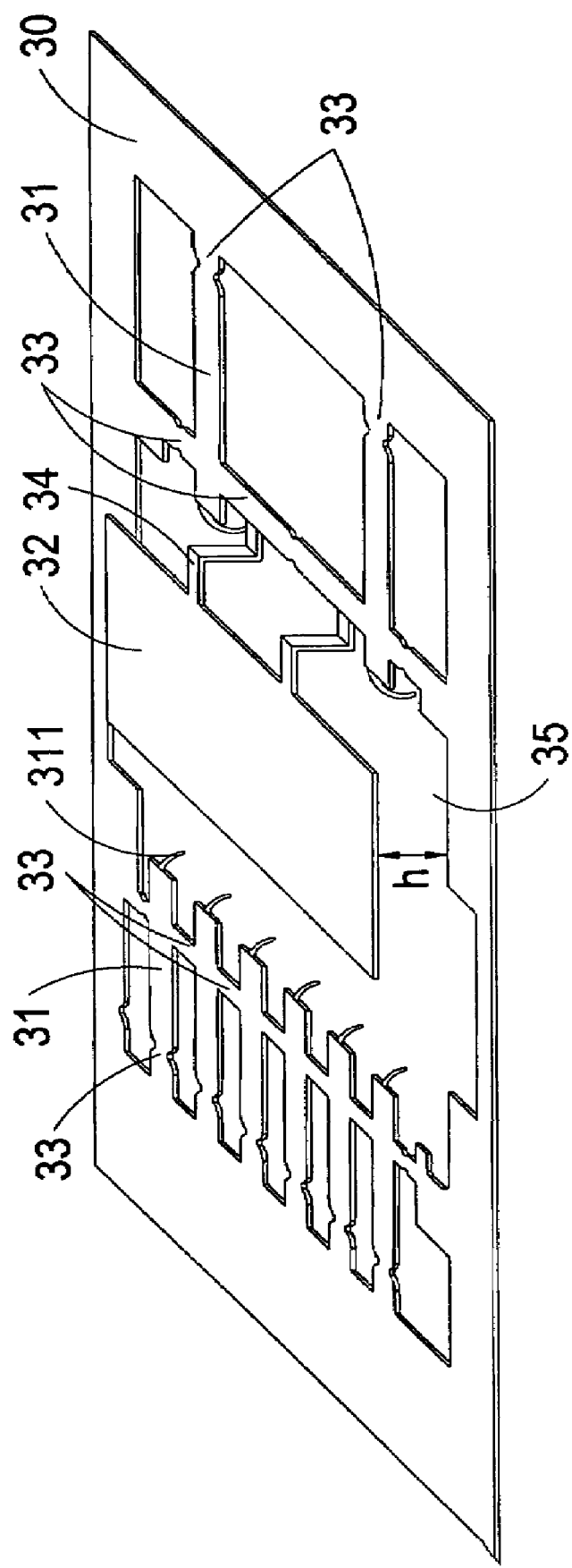
Figure 3C:
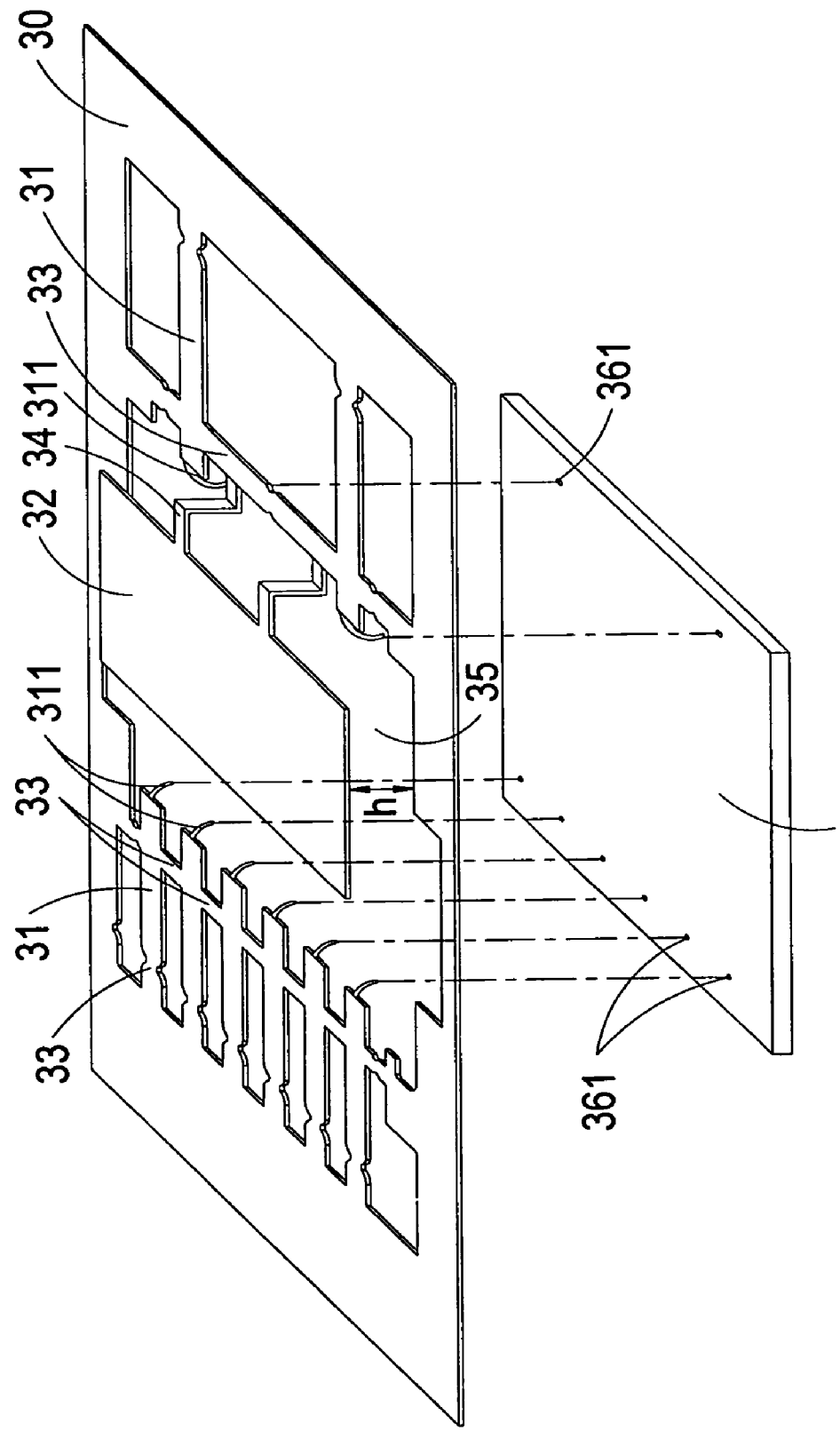
Figure 3D:
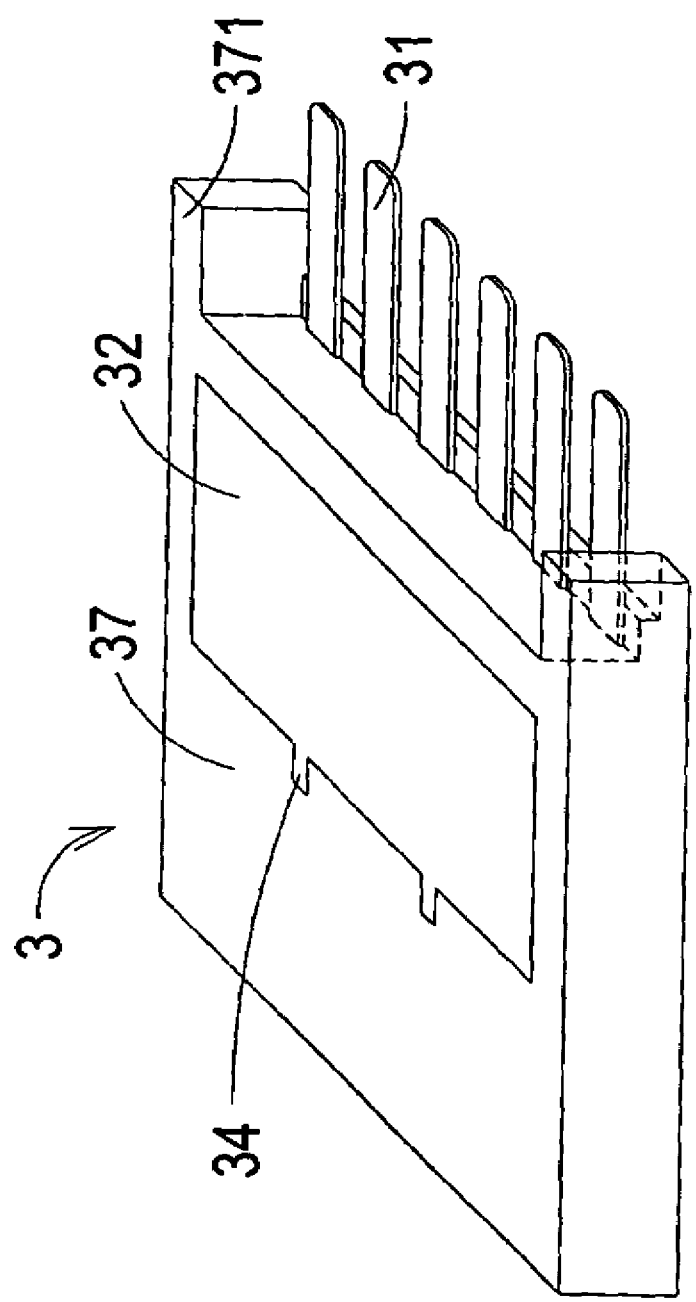

While in the second preferred embodiment of the present invention, the power module is a single in-line package (SIP) power module 3 as shown in FIG. 3(d) by using the fabrication method as shown in FIG. 1 with the metal plate 30 and the circuit board 36 as shown in FIG. 3(a)-(c).

Please refer to FIGS. 1 and 3(a)-(c), a metal plate 30 is provided and a pattern is defined on the metal plate 30 (step S10). The metal plate 30 can be any high thermal conductivity material, such as copper, but not limited thereto. Then the metal plate 30 is cut according to the pattern to form a plane structure with a plurality of pins 31, a heat-conducting plate 32, a plurality of connection parts 33, and a plurality of fixing parts 34 on the metal plate 30 (step S11) as shown in FIG. 3(a). The connection parts 33 are located between two pins 31 and between the pin 31 and the metal plate 30, therefore the pins 31 are connected to each other and retained on the metal plate 30 even after the cutting step S11. The fixing part 34 is located between the heat-conducting plate 32 and the connection part 33, so as to maintain the heat-conducting plate 32 on the metal plate 30.

Next, the first end of each pin 31 is bent downwardly in an angle, such as 90°, to form the extension part 311, meanwhile, the fixing part 34 is bent upwardly to lift the heat-conducting plate 32 up for a height h (step S12). Therefore the heat-conducting plate 32 and the extension part 311 are disposed at different sides of the metal plate 30 respectively. Since the heat-conducting plate 32 and the metal plate 30 are disposed at different levels, a space 35 is formed therebetween, as shown in FIG. 3(b).

Please refer to FIGS. 1 and 3(c), a circuit board 36, such as printed circuit board, with a plurality of via holes 361 is provided. The extension part 311 of each pin 31 is inserted into the via hole 361 of the circuit board 36 correspondingly and penetrated therethrough, and then the extension part 311 of the pin 31 is fixed in each via hole 361 of the circuit board 36 (step S13). The fixing method can be soldering, but other fixing method applicable to the present invention can also be considered. Hence the pin 31 can be secured on the circuit board 36 firmly through the extension part 311 fixed in the via hole 361.

Then, a housing 37 is formed for encapsulating the circuit board 36 therein. The heat-conducting plate 32 is inlaid on the housing 37, as well as partial of the fixing part 34. The second end of each pin 31 is extended out of the housing 37 from two opposite sides thereof and parallel to the heat-conducting plate 32, and the connection part 33 is exposed out of the housing 37. In some embodiments, the housing 37 can be formed by molding, but not limited thereto. Afterward, the connection parts 33 between two pins 31 and between the pin 31 and the metal plate 30 are cut for separating the plural pins 31 from each other and from the metal plate 30 and also isolating each pin 31. Meantime, the fixing part 34 connecting to the heat-conducting plate 32 is cut for isolating the heat-conducting plate 32 from the plural pins 31 (step S 14). Furthermore, the pins 31 extended outwardly from one of the two opposite sides of the housing 37 are cut for making the housing with pins on one side only, so as to form the SIP power module 3 as shown in FIG. 3(d).

Figure 4:
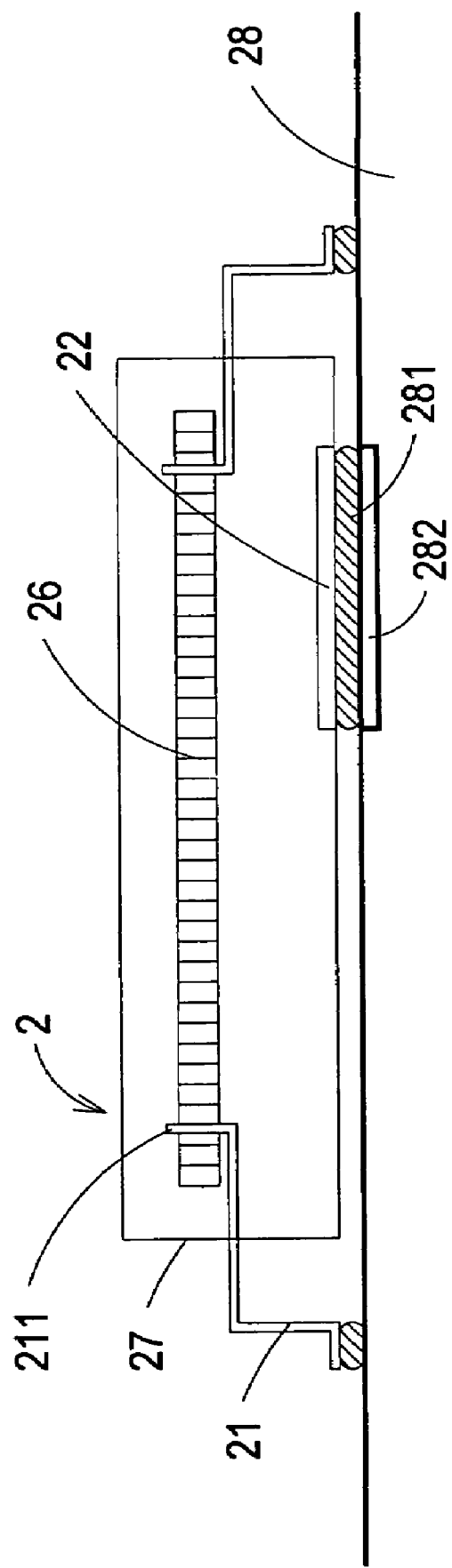
FIG. 4 is a schematic diagram showing the cross section along A'-A' line of the SMD power module shown in FIG. 2(d) while connecting to the system circuit board.

Please refer to FIG. 4, which is a schematic diagram showing the cross section along A'-A' line of the SMD power module shown in FIG. 2(d) while connecting to the system circuit board. As shown in FIG. 4, the SMD power module 2 includes the housing 27, the circuit board 26, the plural pins 21 and the heat-conducting plate 22. The pins 21 are disposed at two opposite sides of the housing 27 with the first ends fixed on the circuit board 26 and the second ends extended outwardly and connected to the system circuit board 28 of an electronic equipment (not shown), thereby the circuit board 26 of the SMD power module 2 is electrically connected to the system circuit board 28 of the electronic equipment. The heat-conducting plate 22, which is inlaid on the housing 27 and separated from the circuit board 26, is connected to the connecting area 282 of the system circuit board 28 via solder 281, for example, but not limited thereto. Hence the heat generated by the SMD power module 2 can be dissipated not only by radiation or convection through five walls of the SMD power module 2 but also by conduction from the plural pins 21 of the SMD power module to the system circuit board 28. In addition, the heat generated by the SMD power module 2 of the present invention can also be dissipated from the wall adjacent to the system circuit board 28 quickly and efficiently by conducting the heat from the heat-conducting plate 22 thereon to the connecting area 282 of the system circuit board 28 for assisting heat dissipation.

Figure 5:
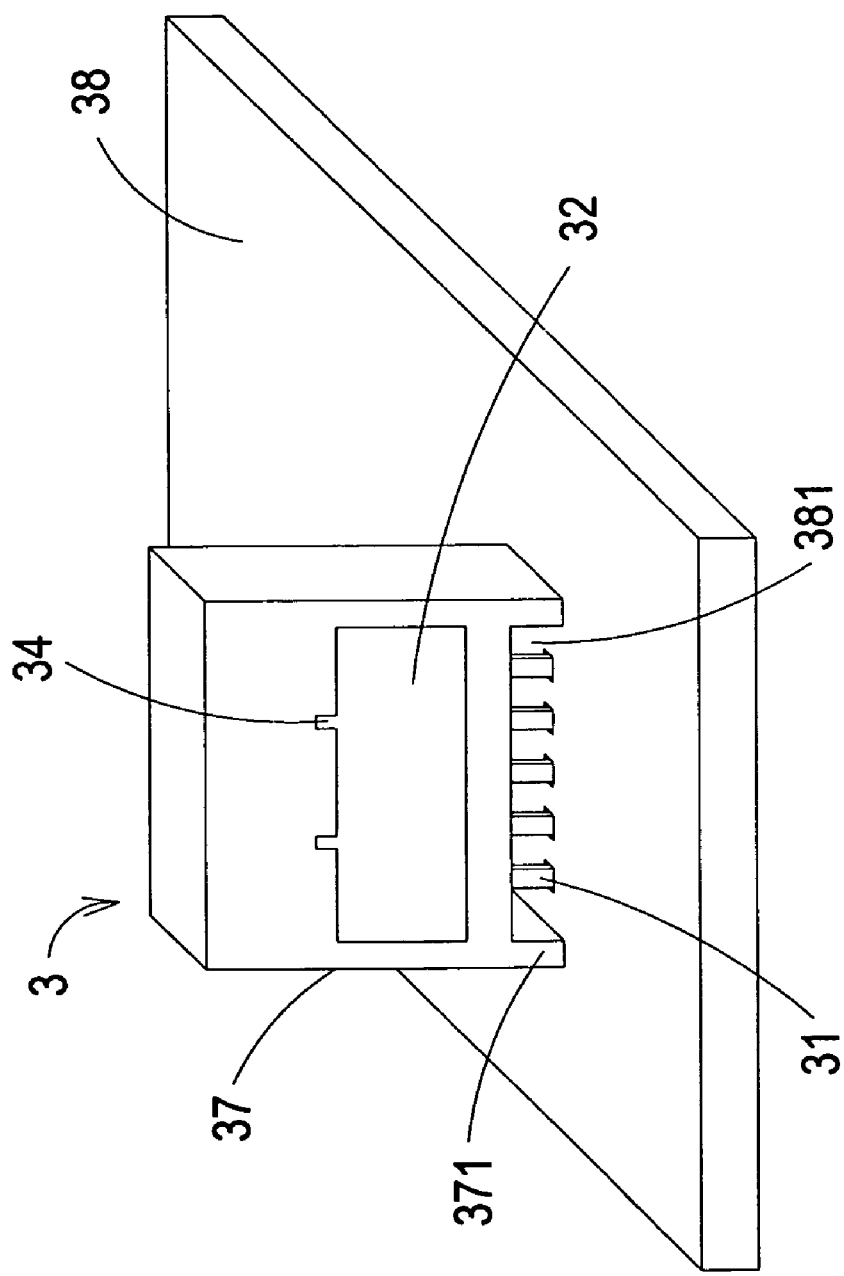
FIG. 5 is a schematic diagram showing the SIP power module of FIG. 3(d) plugged into the system circuit board.

Please refer to FIG. 5, which is a schematic diagram showing the SIP power module of FIG. 3(d) plugged into the system circuit board. As shown in FIG. 5, the SIP power module 3 includes the housing 37 with the protrusions 371, and plural pins 31 on only one side of the housing 37. Similarly, the heat-conducting plate 32 is inlaid on the housing 37 and separated from the circuit board (not shown). Moreover, please refer to FIG. 5 and cooperate with FIG. 3(d), because the lengths of the protrusions 371 are substantially shorter than those of the pins 31 extended outside the housing 37, the protrusions 371 are against the system circuit board 38 while the pins 31 are plugged into the system circuit board 38, so as to form a heat-dissipating space 381 among the protrusions 371, the housing 37, and the system circuit board 38. Hence the SIP power module 3 is electrically connected to the system circuit board 38, and the heat generated by the SIP power module 3 can be dissipated from six walls and the heat-dissipation space 381 thereof by radiation or convection, meantime, the heat can also be dissipated efficiently through the heat-conducting plate 32 for assisting heat dissipation of the SIP power module 3.

Please refer to FIG. 6, which is a schematic diagram showing the side view of the SIP power module of FIG. 5 connected to a system heat-dissipater. As shown in FIG. 6, the heat-conducting plate 32 of the SIP power module 3 is connected to the system heat-dissipater 39 via solder 40, but not limited thereto, and both the SIP power module 3 and the system heat-dissipater 39 are disposed on the system circuit board 38, so as to assist heat dissipation.

To sum up, the fabrication method is simplified and the material is saved by using the same metal plate to form the heat-conducting plate and the pins of the power module. Besides, the mismatch of the pins and the via holes of the circuit board caused by the shift of the pins can be avoided because the pins are still retained on the metal plate during the fixing step (step S13), so as to facilitate the fabrication process. In addition, the heat-conducting plate is connected to the metal plate indirectly by the fixing part connecting to the connection part, therefore it is to be understood that the heat-conducting plate can be directly inlaid on the housing while forming the housing and firmly fixed thereon. Furthermore, the heat generated by the miniaturized power module of the present invention can be dissipated not only by radiation and convection through the housing and by conduction through the pins as those conventional miniaturized power modules, but also by conduction from the heat-conducting plate to the connecting area of the system circuit board or the system heat-dissipater. Therefore the heat dissipating efficiency can be raised up comparing to that of the conventional power module.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A fabrication method of a power module, comprising steps of:
   providing a metal plate and defining a pattern on said metal plate;
   cutting said metal plate according to said pattern to form a plurality of pins and a heat-conducting plate, wherein said pin is coupled to each other or to said metal plate via a connection part and said heat-conducting plate is coupled to said connection part via a fixing part;
   bending a first end of said pin to form an extension part and bending said fixing part to dispose said heat-conducting plate and said metal plate at different levels;
   providing a circuit board with a plurality of via holes and inserting said extension part into said via hole correspondingly and fixing said pin on said circuit board;
   forming a housing to encapsulate said circuit board therein, wherein said heat-conducting plate is inlaid on said housing and a second end of said pin is extended out of said housing; and
   cutting said connection part and said fixing part to separate said pin from each other and from said metal plate and isolate said pin and said heat-conducting plate.

2. The fabrication method of a power module according to claim 1 wherein said extension part of said pin is fixed in said via hole of said circuit board by soldering.

3. The fabrication method of a power module according to claim 1 wherein said housing is formed by molding.

4. The fabrication method of a power module according to claim 1 wherein said power module is a surface mounted device power module and said second end of said pin is extended outwardly from two opposite sides of said housing.

5. The fabrication method of a power module according to claim 4 wherein said second end of said pin is further bent for connecting to a system circuit board.

6. The fabrication method of a power module according to claim 1 wherein said power module is a single in-line package power module and said second end of said pin is extended outwardly from one side of said housing for plugging into a system circuit board.

7. The fabrication method of a power module according to claim 6 wherein said housing further comprises a protrusion having a length shorter than that of said pin outside said housing so as to form a heat-dissipating space among said protrusion, said housing and said system circuit board when said pin is plugged into said system circuit board.

8. The fabrication method of a power module according to claim 1 wherein said heat-conducting plate is connected to a connecting area of a system circuit board by soldering for assisting heat dissipation.

9. The fabrication method of a power module according to claim 1 wherein said heat-conducting plate is connected to a system heat-dissipater by soldering for assisting heat dissipation.

10. The fabrication method of a power module according to claim 1 wherein said metal plate is a copper plate.

* * * * *